United States Patent [19]

Nadd

[11] Patent Number: 5,003,246
[45] Date of Patent: Mar. 26, 1991

[54] MONOLITHIC BIDIRECTIONAL SWITCH WITH POWER MOS TRANSISTORS

[75] Inventor: Bruno Nadd, Lourmarin par Cadenet, France

[73] Assignee: SGS-Thomson Microelectronics S.A., Gentilly, France

[21] Appl. No.: 400,908

[22] Filed: Aug. 30, 1989

[30] Foreign Application Priority Data

Aug. 31, 1988 [FR] France ................. 88 11658

[51] Int. Cl.$^5$ .................. H03K 17/687; G05F 1/44
[52] U.S. Cl. ................................ 323/349; 307/570; 307/571; 307/585
[58] Field of Search ............... 323/265, 282, 284, 289, 323/349, 351, 237, 300, 320; 307/262, 264, 270, 296.8, 296.5, 544, 548, 554, 584, 585, 570–577

[56] References Cited

U.S. PATENT DOCUMENTS

| | | |
|---|---|---|
| 3,740,581 | 6/1973 | Pfiffner . |
| 4,480,201 | 10/1984 | Jaeschke . |
| 4,591,734 | 5/1986 | Laughton . |
| 4,649,302 | 3/1987 | Damiano et al. ................. 307/571 X |
| 4,686,383 | 8/1987 | Croft ................................ 307/571 X |
| 4,888,504 | 12/1989 | Kinzer ................................. 307/570 |

FOREIGN PATENT DOCUMENTS

| | | |
|---|---|---|
| 3133518 | 3/1983 | Fed. Rep. of Germany . |
| 2373195 | 6/1978 | France . |
| 2158314 | 11/1985 | United Kingdom . |

Primary Examiner—Steven L. Stephan
Assistant Examiner—Emanuel Todd Voettz
Attorney, Agent, or Firm—Lowe, Price, Leblanc, Becker & Shur

[57] ABSTRACT

A single-chip solid-state bidirectional switch comprises two power MOS transistors (TP1, TP2) connected by their drains (D1, D2), and the sources of which (S1, S2) constitute the main terminals (A1, A2) of the switch; two auxiliary MOS transistors (T1, T2) each of which is connected by its main terminals between the source and the gate of each power transistor, the gates of those auxiliary MOS transistors being connected to the common drain of the power transistors; and two high-value resistors (R1, R2), respectively connected between the gate (G1, G2) of each power transistor and the control terminal (G) of the solid-state switch.

17 Claims, 5 Drawing Sheets

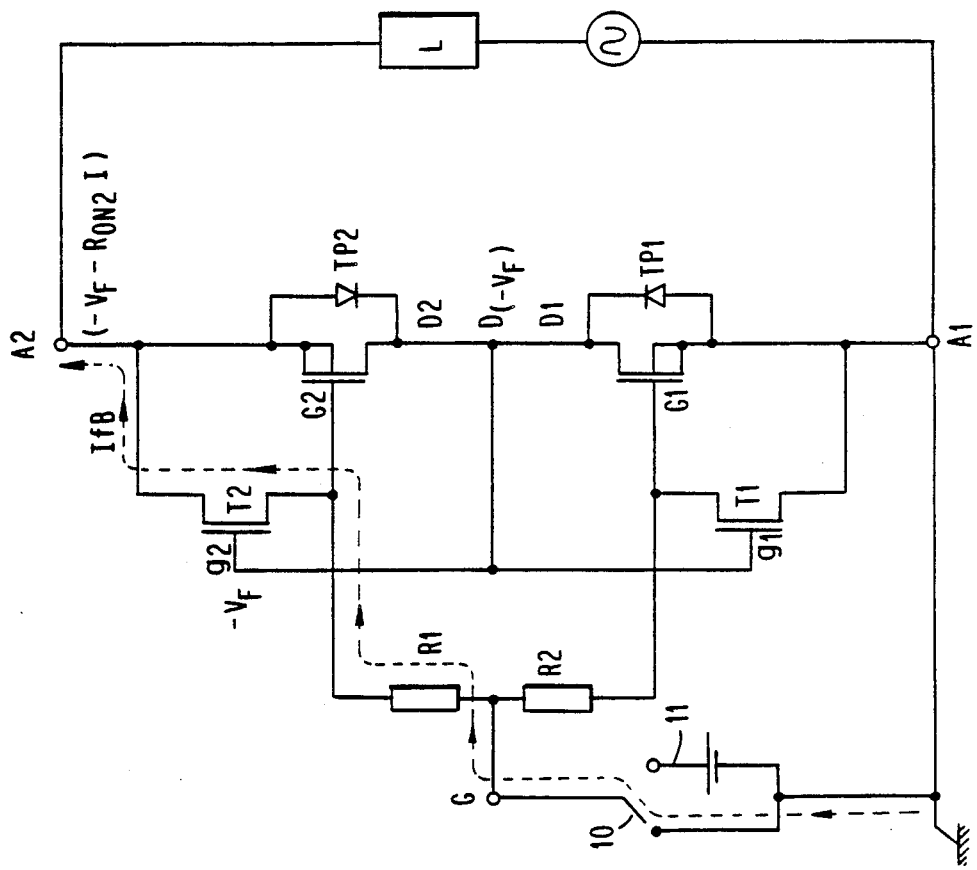
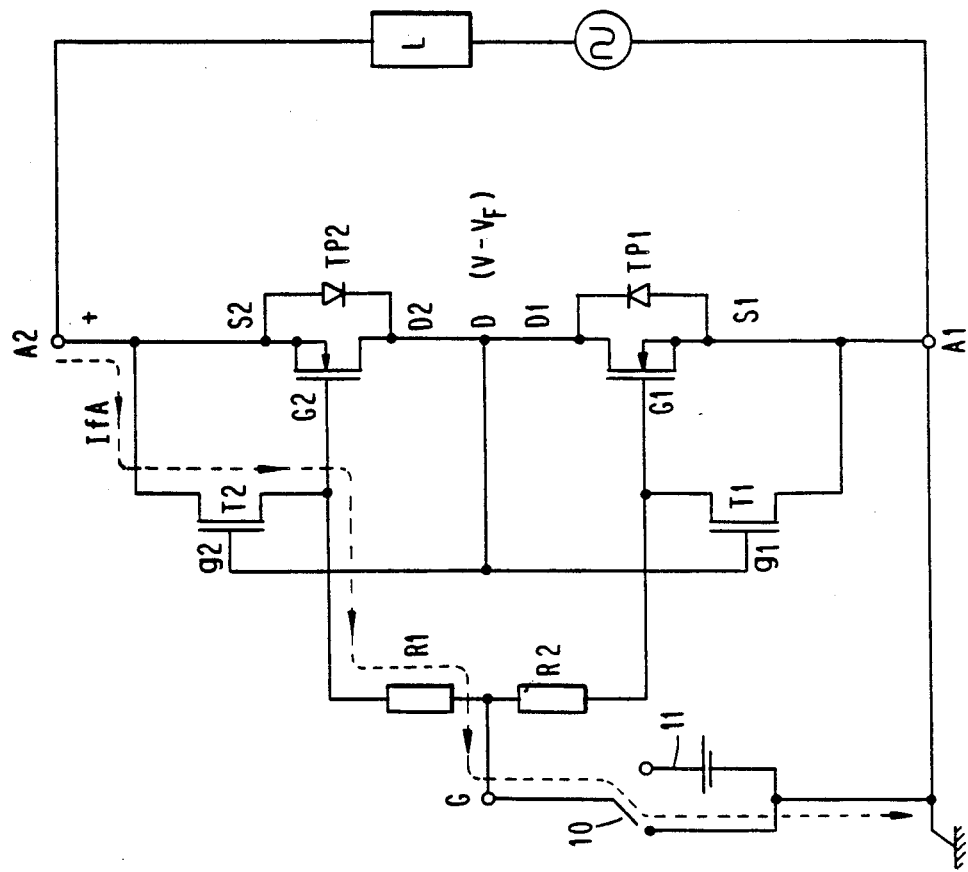
Figure 1B
Figure 1A

MONOLITHIC BIDIRECTIONAL SWITCH WITH POWER MOS TRANSISTORS

BACKGROUND OF THE INVENTION

1. Technical Field

The invention relates to the field of power bidirectional switches. It more particularly applies to a new type of monolithic bidirectional switch.

2. Background Art

In prior art, the triac is the only existing monolithic bidirectional switch. The advantages and drawbacks of triac devices are well known to those skilled in the art. For example, one of the drawbacks of a triac is that current flow is blockable only during the zero-crossing of the current. It is therefore impossible to use a triac to block an overcurrent condition in case of load shorting.

Thus, in numerous applications, in consideration of the drawbacks of the triac, non-monolithic devices are used as a bidirectional switch, for example: a thyristor or a MOS transistor or a power bipolar transistor arranged in a rectifying a set of two power bipolar transistors having commonly connected collectors; or a pair of power MOS transistors with commonly connected sources.

SUMMARY OF THE INVENTION

An object of the invention is to provide a monolithic bidirectional switch using power MOS transistors with all the advantages inherent thereto, this bidirectional switch operable to be switched off at any time independently of the current that flows therethrough or of the voltage state at its terminals.

Those objects, characteristics and advantages of the invention are attained by means of a single-chip solid-state bidirectional power switch comprising two main power transistors connected by their first main electrodes non-referenced to their control terminals, their second main electrodes referenced to their control terminals constituting the main terminals of the switch, and two auxiliary MOS transistors, each one being connected by its main terminals between the second main terminal and the control terminal of each power transistor. The gates of those auxiliary MOS transistors are connected to the common first main electrode of the power transistors. Two high-value resistors are respectively connected between the control terminal of each power transistor and the control terminal of the power switch.

The control terminal of the power switch is connected either to one of the main electrodes for setting a switching-on order, or to a voltage, positive with respect to that control terminal, for setting a switching-off order.

The main transistors are preferably vertical power MOS transistors, the first main electrode of which is the drain and the second main electrode of which is the source.

The foregoing and other objects, features and advantages of the invention will be apparent from the following detailed description of a preferred embodiment as illustrated in the accompanying drawings.

BRIEF DESCRIPTION OF THE DRAWINGS

FIGS. 1A–1D are schematic diagrams of a simplified embodiment of a monolithic bidirectional switch according to the invention in four different configurations as regards the terminals voltage and the applied control signal.

DETAILED DESCRIPTION OF THE INVENTION

Figure 1D:
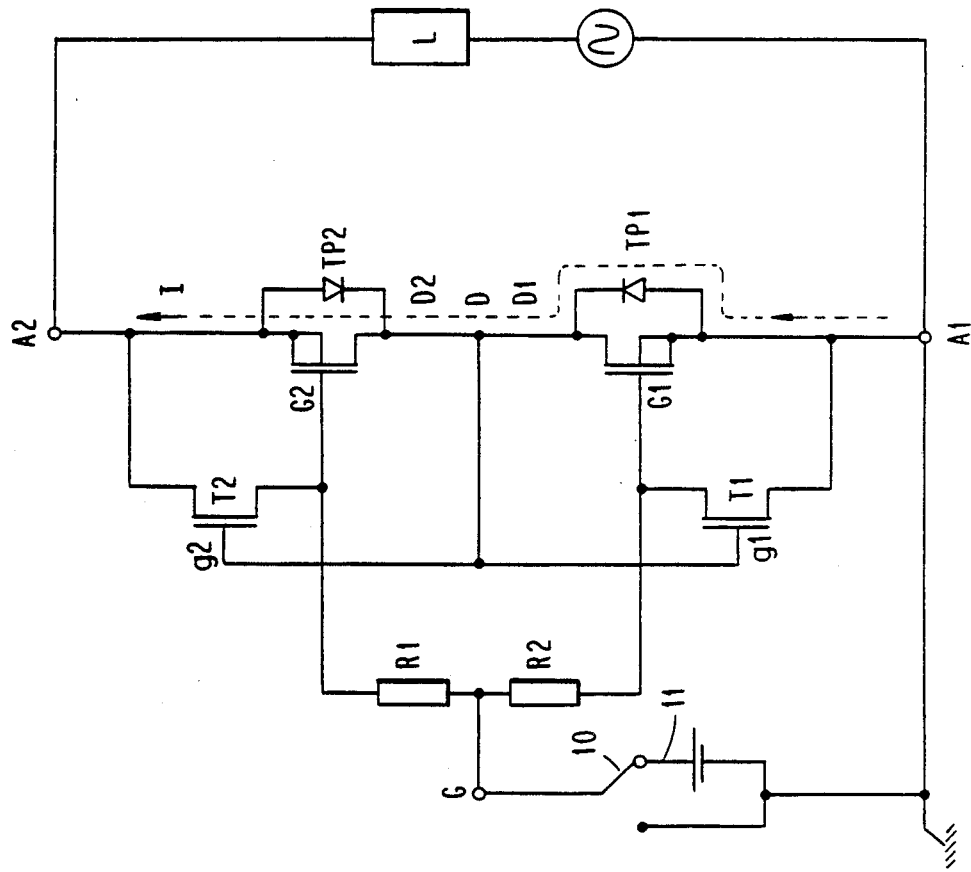
Figure 1C:
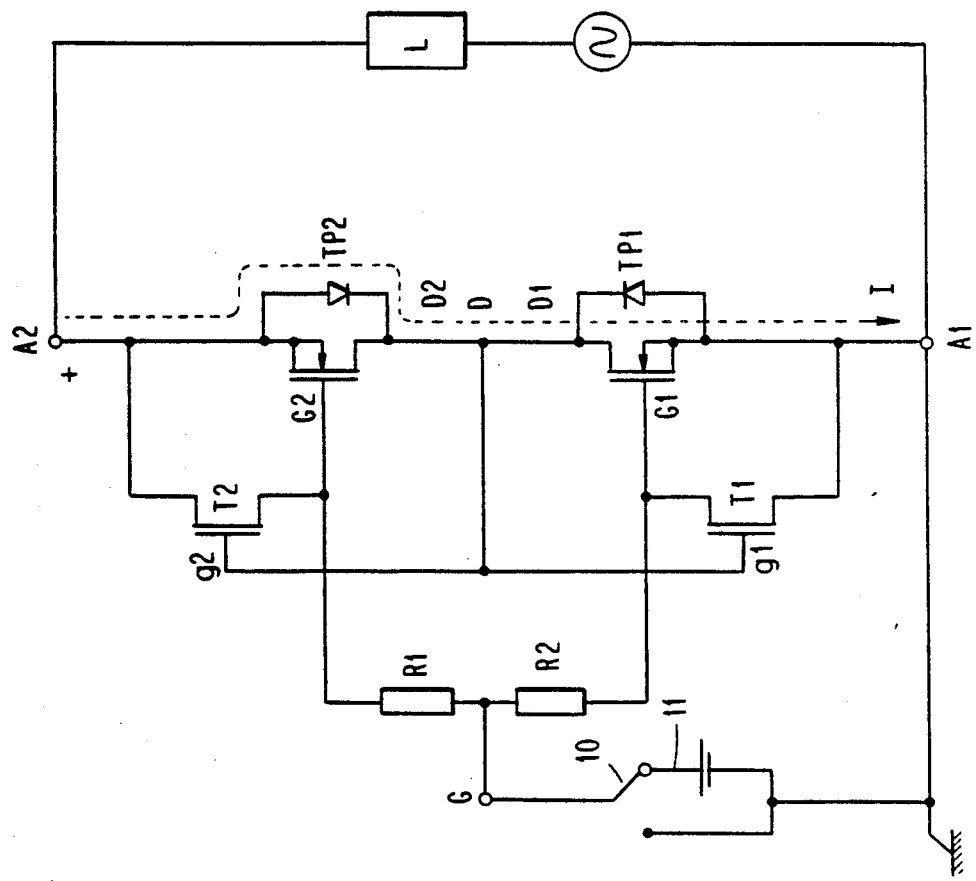

FIGS. 1A–1D show a preferred embodiment of a bidirectional switch according to the invention. The switch comprises main terminals A1 and A2 and a control terminal G. In the following description, it is assumed that terminal A1 supplied with a reference voltage and terminal A2 is at a voltage positive or negative with respect to this reference voltage.

This bidirectional switch is designed to control the current flow in a load L in series with a current supply, for example in the primary portion of the supply. The switch is controlled by selectively connecting control terminal G through a switch 10 either to the reference voltage, such as ground potential, or to a terminal 11 of a d.c. voltage source. The d.c. voltage is shown as being a positive potential with respect to the reference voltage. The bidirectional switch is turned off by connecting terminal G to the reference voltage and is turned on on by connecting terminal G to positive voltage source 11.

The power switching portion of the bidirectional switch is comprised of two power MOS transistors TP1 and TP2 having interconnected drains. The source of transistor TP1 is connected to terminal A1 and the source of transistor TP2 to terminal A2.

In a conventional implementation of a power MOS transistor using a vertical type diffused MOS transistor, the source is the main terminal of the power transistor and is connected to the well in which a channel is formed. The drain is usually constituted by the rear surface of the power MOS transistor, except for some cases in which various techniques are used for positioning back the drain contact on the front surface. Thus, as disclosed below, it is relatively simple to connect two power MOS transistors by their drains.

In FIG. 1A, S1 and S2 designate the sources of transistors TP1 and TP2, D1 and D2 are the respective drains, the common mode thereof referenced as D, and G1 and G2 designated the control gates of transistors TP1 and TP2.

Each of power MOS transistors TP1 and TP2 is shown in the form of a MOS transistor and parallelconnected diode, conductive from the source towards the drain. The parallel diode exists in practical implementations of power MOS transistors. The source and the gate of each power MOS transistor TP1, TP2 are connected through auxiliary transistors, respectively T1 and T2 having gates g1 and g2 interconnected and coupled to the common drain D of the power transistors. Transistors T1 and T2 are not necessarily realized according to power transistor technology so that there are no physical differences between source and drain. That is, the terminal having the lower voltage will act as the source and the other as a drain. Lastly, the gates G1 and G2 of transistors TP1 and TP2 are connected through high-value resistors R1 and R2, respectively to the control terminal G of the switch.

OPERATION OF THE POWER SWITCH

(1) Application of a switching-on order during a positive half period

This operation of the bidirectional switch of FIG. 1A will be described with reference to curves V, GA and IA of FIG. 2. As shown in FIG. 2, the time interval t0–t1 corresponding to a positive half period of the mains voltage V will be considered and it is assumed that, during this half period, a signal GA switching from "1" to "0" (from a positive value to the reference voltage) is applied to the control terminal.

In this configuration, terminal A2 is positive with respect to terminal A1 and, before operating switch 10 to turn the power switch circuit off, a load current flows from terminal A2 to terminal A1 through the parallel diode of transistor TP2 and through transistor TP1. As soon as the reference voltage is applied to terminal G, that is, to the source voltage of TP1, this transistor is rendered nonconductive, i.e., is blocked off. The voltage on the common drain D remains equal to the voltage V on terminal A2 minus the forward voltage drop (VF) in the parallel diode of transistor TP2. This voltage V-VF is applied to the gate of transistor T2. Resistor R2 causes a current IfA to flow from the source of transistor T2 which is biased at V-VF-VT (VT being the threshold voltage of the MOS transistor). This current IfA constitutes a leakage current which flows from terminal A2 through transistor T2 by means of resistor R2 towards terminal G and the reference voltage. Therefore, resistor R2 is selected to have a high resistance value; in order to limit this leakage current. It will be possible to select for example a value of about one megohm, which limits the leakage current to 220 microamperes for a 220-volt potential applied to terminal A2. The path of this leakage current is shown in dotted lines in FIG. 1A.

To summarize, as shown by curve IA of FIG. 2, the bidirectional switch is substantially open or off in response to being a ground potential level supplied by switch 10.

(2) Application of a switching-off order during a negative half period

This case is illustrated in FIG. 1B in relation with curves GB and IB of FIG. 2. It is assumed that initially the potential at terminal A2 is negative with respect to terminal A1 (voltage −V) and that the system is conductive, that is, the main current flows in the parallel diode of transistor TP1 and that transistor TP2 is conductive. In such a state, the voltage on terminal D is −VF (forward voltage drop of the diode of transistor TP1) and the voltage on terminal A2 is equal to −VF−$R_{ON}$I, wherein I is the current flowing through the switch and $R_{ON}$ is the resistance of TP2 in the conductive state. During this conductive state, the gate G2 of transistor TP2 is substantially at the voltage of the control positive current source 11, for example 10 volts.

When the control terminal G is grounded, the voltage on gate G2 of transistor TP2 tends to drop, so that transistor TP2 progressively becomes less conductive and its internal resistance increases. The voltage at terminal A2 tends to decrease (i.e., to become more negative) and consequently transistor T2, the gate of which remains at voltage −VF, becomes conductive, while shorting the gate and the source of transistor TP2 so that TP2 completely turns off. Then, a leakage current IfB flows from terminal G towards terminal A2 through resistor R2 and transistor T2.

As shown by curve IB, the bidirectional switch according to the invention turns off, substantially at the same time as the voltage of gate G drops to ground potential.

It has been hereinabove shown that setting the control terminal G to the reference voltage at which terminal A2 is connected causes the switching off of the bidirectional switch according to the invention both when a positive half period or a negative half period is applied across the main terminals of the bidirectional switch. It is therefore apparent that, if the control terminal G is connected to the reference voltage, the bidirectional switch according to the invention switches off and remains in the OFF state. However, slight spurious pulses may occur at the zero-crossings, while the control voltage is null. In order to avoid those spurious pulses, it will be possible to select as a threshold voltage for the power transistor TP2 a voltage higher than the threshold voltage of transistor T2 plus a forward diode voltage drop (VF). Another method would consist in connecting a voltage shifting device in series with the gates of transistors T1 and T2. Means for realizing such voltage shifting devices are known by those skilled in the art.

(3) Application of a switching-on order during a negative half period

In that case, the situation shown in FIG. 1B is considered and the switch 10 is switched from the reference voltage to a positive voltage, for example about 10 volts, with respect to this reference voltage. This does not change in any way the operation illustrated. Only the leakage current slightly increases due to the fact that transistor T2 was conductive and that the voltage on its drain increases. It is only when the voltage applied on terminal A2 is reversed (FIG. IC) that a change occurs. Indeed, in that case, the auxiliary transistor T2 turns off because of the reverse bias on its terminals. Transistor TP1 which receives +10 volts at its gate becomes conductive. Transistor T1 then turns off since its gate/source voltage is about $R_{ON}$I, which is lower than its threshold voltage.

According to an important characteristic of the invention, it will be understood that, if the current in the circuit substantially increases, for example because the load is shorted, the voltage drop $R_{ON}$I in the power transistor TP1 will become higher than the threshold voltage $V_{TH1}$ of the auxiliary transistor T1 and the latter will then become conductive and turn transistor TP1 off. Thus, by adequately selecting the threshold voltage of transistor T1, one provides for an intrinsically safe switch which automatically turns off in case of load shorting.

The curves GC and IC of FIG. 2 sum up the operation of the bidirectional switch according to the invention in the case that has just been described: if a switching-on order is given during a positive half period between the times t0 and t1, the bidirectional switch starts allowing a charge current IC to beginning at from the next voltage zero-crossing (time t1).

(4) Application of a switching-on order during a positive half period

Figure 2:
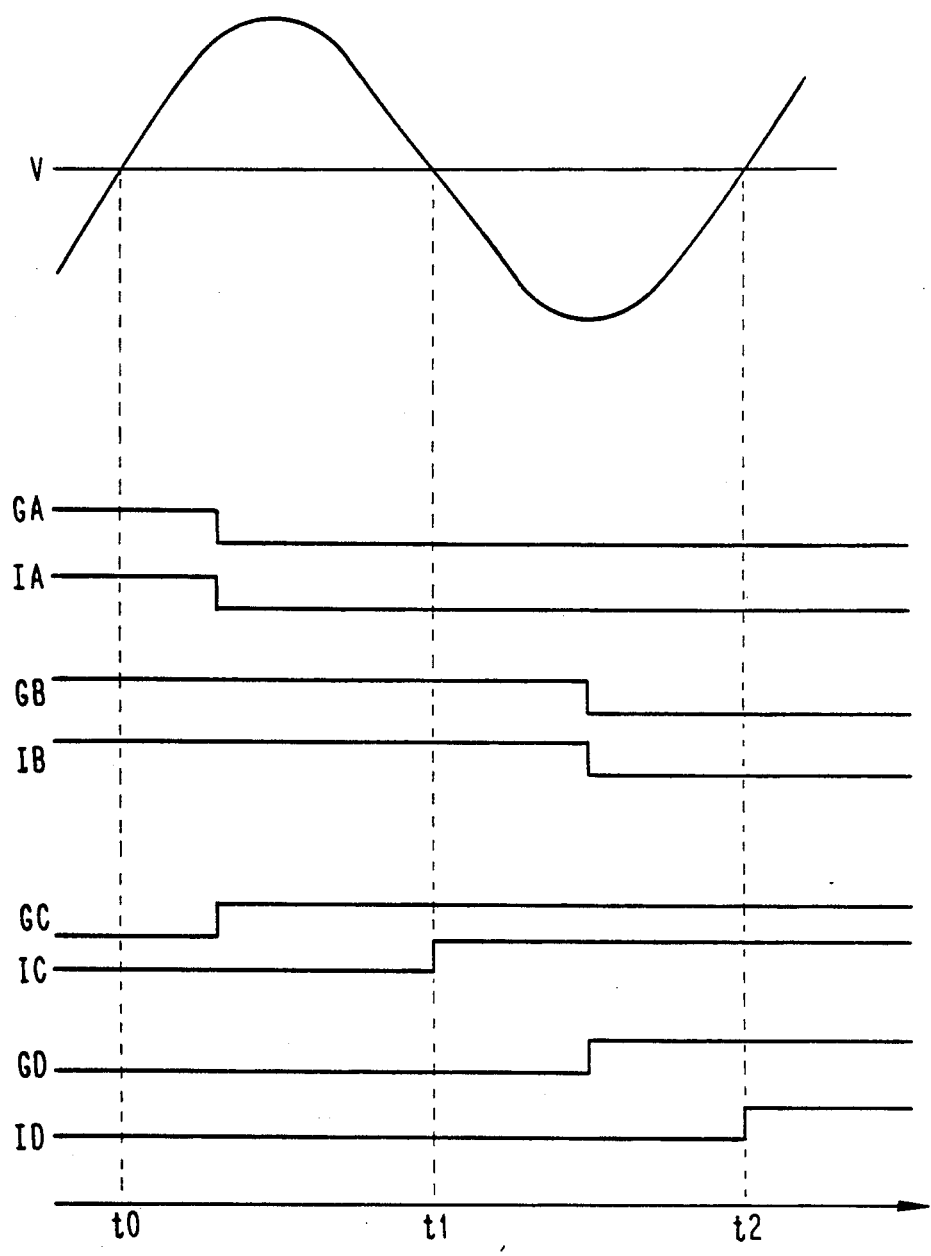
FIG. 2 is a timing diagram illustrating the operation of the circuit shown in FIGS. 1A–1D in various biasing configurations.

Referring to FIG. 1A, the bidirectional switch is initially off and the voltage on terminal A2 is substantially equal to the positive voltage of the mains. When the control terminal passes from the reference voltage to a positive voltage, for example 10 volts, with respect to the reference voltage, transistor T2 remains conductive as long a the mains voltage is higher than the value of the voltage source 11, for example 10 volts (in fact, a slightly higher value since it is necessary to take into account the threshold voltage of transistor T2 and the forward voltage drop in the parallel diode of the power transistor TP2). At that time (FIG. 1D), transistor T2 turns off and a 10-volt voltage is applied to the terminal of gate G2 of transistor TP2. TP2 becomes conductive as soon as terminal A2 becomes negative enough with respect to terminal A1. As for transistor T2, it remains in a nonconductive off state provided that its threshold voltage is lower than the voltage drop $R_{ON}I$ across the terminals of transistor TP2.

If the voltage drop $R_{ON}I$ increases because of a substantial increase of current I, for example in case of load shorting, transistor T2 becomes conductive and turn off transistor TP2. Thus, as it is the case for conduction during a positive half period, a conductive state during a negative half period is intrinsically safe with respect to load shortings.

Curves GD and ID of FIG. 2 show that, when voltage GD on the control gate is set to "1", current in the bidirectional switch starts flowing only after the next polarity reversal in the mains voltage.

IMPLEMENTATION

Figure 3:
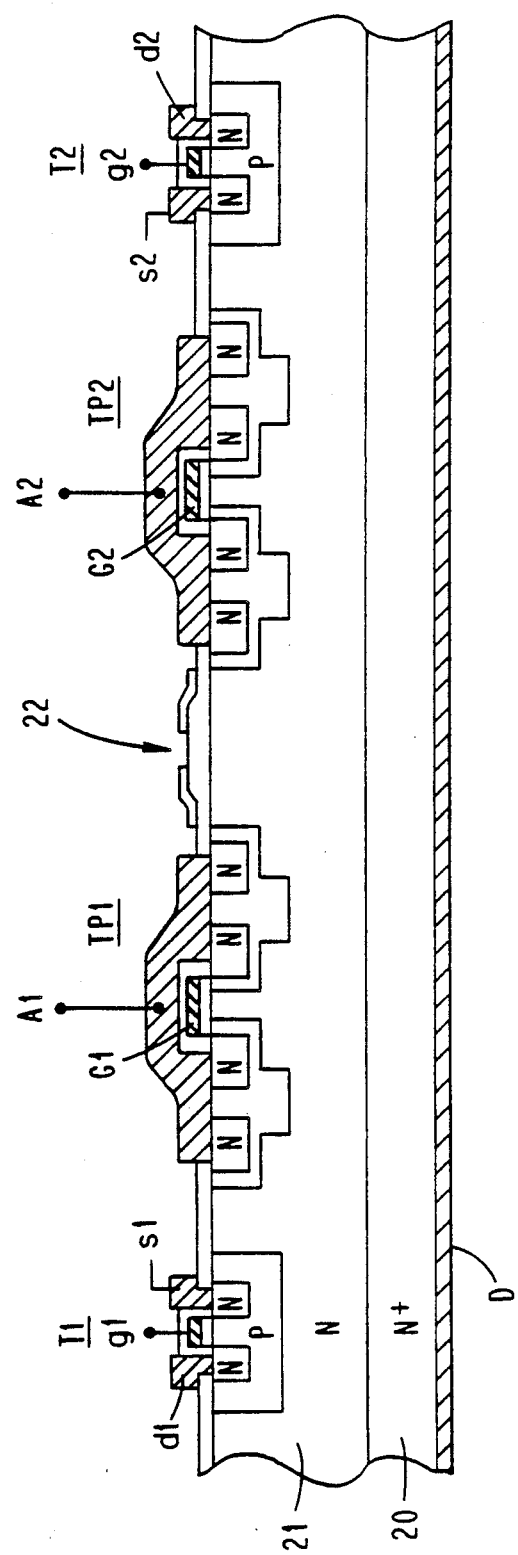
FIG. 3 is a cross sectional view of a semiconductive layer illustrating an exemplary implementation of a bidirectional switch according to the invention.

FIG. 3 shows a cross section view of an exemplary structure according to the invention. As is usual in the representation of integrated circuits, this figure is not drawn to scale, especially with regard to the thicknesses of the layers which are arbitrarily drawn for the sake of legibility of the figure.

In this sectional view, the various electrodes are labelled in correspondence with FIG. 1A. The structure is implemented in a substrate comprising an N+ — type layer 20 and a low impurity concentration doped N- type layer 21. In this layer 21, two power MOS transistors TP1 and TP2 are formed, in this case of the vertical diffused-channel (VDMOS) type, with the source electrodes thereof connected to terminals A1 and A2.

The auxiliary transistors T1 and T2 are conventionally carried out in the form of lateral MOS transistors in P type wells formed in the layer 21. The connection between terminals g1 and g2 and the opposite surface which constitutes the drain terminal D can be made at the device terminals, or electrodes g1 and g2 can be connected to a deep N+ well formed in layer 21 and therefore substantially at the same voltage as the drain electrode D. The connection may have an acceptable small resistivity since substantially no current flows between electrodes g1 and D, and g2 and D, respectively.

FIG. 3 also shows field plates in region 22 separating the two power transistors. Other conventional means for distributing the field lines or to avoid the influence of one of the power transistors over the other can be used. As usual, the partial section view of FIG. 3 shows only one power transistor cell for each of transistors TP1 and TP2. In fact, as conventional in the technology of diffused MOS-type power transistors, a very large number of cells are used for constituting each of transistors TP1 and TP2.

It will be apparent to those skilled in the art that the bidirectional switch according to the invention can be implemented using technologies other than the one illustrated in FIG. 3, most of the power MOS transistor technologies being usable for realizing common drain power transistors.

Of course, various variants and improvements can be brought to the basic arrangement of FIGS. 1A–1D to improve or modify some features of the bidirectional swith according to the invention.

Figure 4:
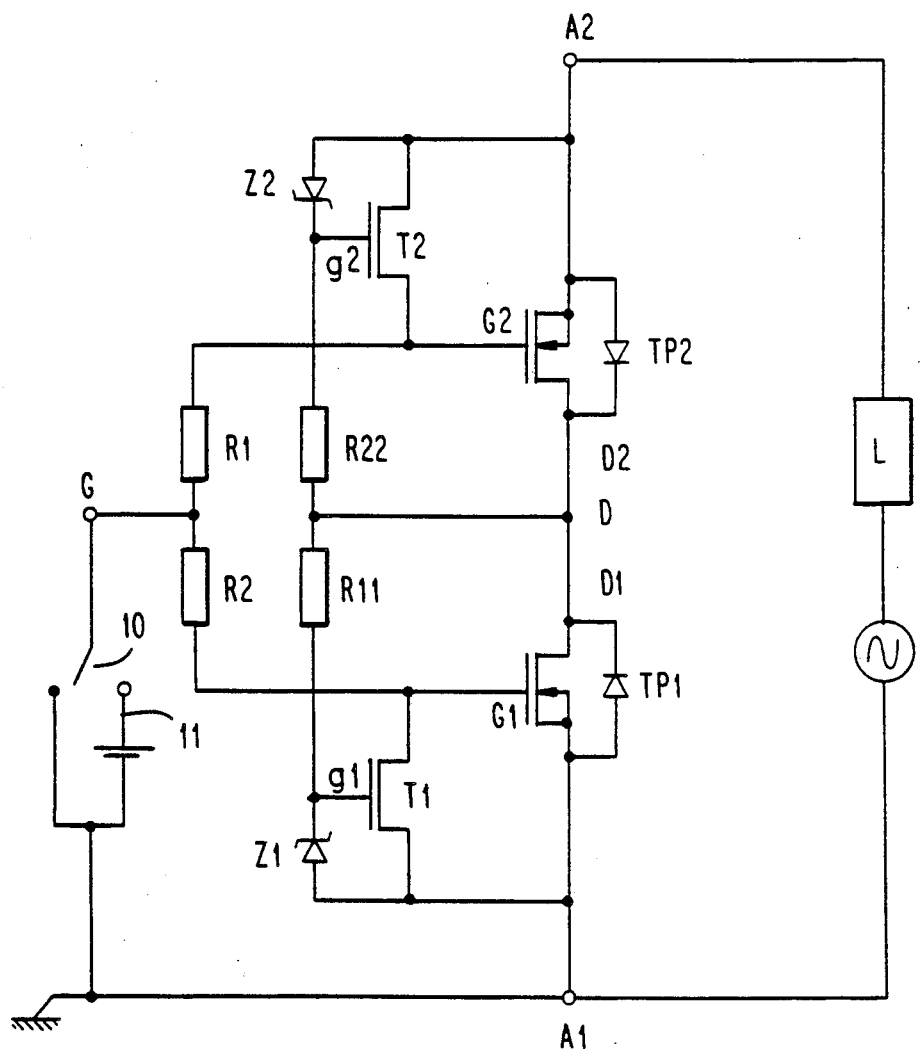
FIG. 4 is a schematic diagram of a practical variant of the circuit of FIGS. 1A–1D.

For example, as shown in FIG. 4, in order to avoid applying the mains voltage between the gate and source of the various MOS transistors T1, T2, TP1 and TP2, it is Zener diodes Z1, Z2, are added between each gate and each source of the MOS transistors, with a relatively high-value resistor R11, R22 connected between the gates of the auxiliary transistors T1 and T2 and the common drain of transistors TP1 and TP2.

Similarly, according to the invention, power MOS transistors TP1 and TP2, instead of being conventional MOS transistors, can be isolated gate transistors (IGT) wherein, referring to FIG. 3, a P-type layer is formed on the lower surface of the component. Also, the power MOS transistors can be associated with bipolar transistors integrated on the same chip for forming MOS-bipolar Darlington combinations. In such an arrangement, the collector of each NPN type bipolar power transistor is connected to the drain of each of the MOS transistors, the bases of the bipolar transistors being connected to the sources of transistors TP1 and TP2. A series resistor is added between the source of each MOS transistor and the connection point with the source of each auxiliary transistor, the emitter of each bipolar transistor being connected to this connection point.

In summary, the invention provides for a monolithic bidirectional switch exhibiting, especially, the following features and advantages:

voltage control, with resultant low consumption of the control current, the capability of switching off at any time of the cycle, switching on only during the zero-crossings of the voltage across the terminals, automatic switching off in case of load shorting, perfect electric symmetry of the main terminals, possibility of integrating some complex functions on the integrated circuit chip comprising the bidirectional switch, for example control logical function and protection functions.

Although the present invention has been described and illustrated in detail, it is clearly understood that the same is by way of illustration and example only and is not to be taken by way of limitations the spirit and scope of the present invention being limited only by the terms of the appended claims.

I claim:

1. A bidirectional monolithic solid-state switch, comprising:

two main power transistors having respective first main electrodes, not referenced to respective control terminals, commonly connected, said main power transistors further including respective second main electrodes, each referenced to said respective control terminals, constituting switching terminals of the switch;

two auxiliary MOS transistors, each having respective main terminals connected between the second main terminal and the control terminal of each power transistor, the gates of the auxiliary MOS transistors being connected to the first main electrodes of the power transistors; and two high-value resistors, respectively connected between the control terminal of each power transistor and a control terminal of the switch.

2. A bidirectional switch according to claim 1 comprising means for selectively connecting said control terminal either to (i) one of the main switching terminals to cause said switch to turn off, and (ii) to a positive voltage level with respect to said one main switching terminal to cause said switch to turn on.

3. A bidirectional switch according to claim 1 wherein the main transistors are vertical power MOS transistors, the first main electrode of which is the drain and the second main electrode being the source.

4. A bidirectional switch according to claim 3 wherein the threshold voltage of the auxiliary MOS transistor is selected to be lower than the threshold voltage of the power MOS transistors minus a diode forward voltage drop.

5. A bidirectional switch according to claim 3 wherein voltage dropping means are connected between respective ones of the gates of the auxiliary transistors and respective ones of said power transistor drains.

6. A bidirectional switch according to claim 3 wherein zener diodes are arranged between the gate and source of each of the auxiliary transistors, and a resistor is integrated between each auxiliary transistor gate and the common drain of the power transistors.

7. A bidirectional switch according to claim 3 wherein the power transistors are associated with bipolar transistors in a Darlington circuit.

8. A bidirectional switch according to claim 1 wherein the power transistors are of the gate controlled bipolar transistor type.

9. A bidirectional monolithic solid-state switch, comprising:
a pair of switch terminals for providing power to a load;
a control terminal for receiving a signal for controlling an operation of said switch;
a pair of resistors, each having a terminal connected to said control terminal;
a pair of power transistors having drain terminals connected in common and source terminals connected to respective ones of said switch terminals, each of said power transistors having a gate terminal connected to said control terminal through respective ones of said resistors; and
a pair of auxiliary MOS transistors having gate terminals connected to said drain terminals of said power transistors, each of said auxiliary MOS transistors having a first source/drain electrode connected to a respective one of said switch terminals and a second source/drain electrode connected to a respective one of said gate terminals of said power transistors.

10. A switch according to claim 9, further comprising a voltage supply and control means for selectively connecting said control terminal either (i) directly to one of said switch terminals or (ii) to said one of said switch terminals through said voltage supply.

11. A switch according to claim 9, further comprising means for selectively supplying to said control terminal either (i) a voltage level present at one of said switch terminals or (ii) said voltage level present at said one of said switch terminals offset by a predetermined positive value.

12. A switch according to claim 9 wherein said power transistors comprise vertical power type MOS transistors.

13. A switch according to claim 9 wherein threshold voltages of said auxiliary MOS transistors are lower than threshold voltages of said power transistors minus a diode forward voltage drop.

14. A switch according to claim 9 further comprising a pair of voltage dropping means respectively connected between a respective one of said auxiliary transistor gates and respective one of said switch terminals.

15. A switch according to claim 9 further comprising a pair of zener diodes respectively connected between respective gates and source/drains of said auxiliary transistors and a pair of resistors, each connected in series with a respective one of said auxiliary transistor gates between said respective gate and said power transistor drains.

16. A switch according to claim 9 further comprising a pair of bipolar transistors connected with respective ones of said power transistors in a Darlington circuit.

17. A switch according to claim 9 wherein each of said power transistors comprises a gate controlled bipolar transistor.

* * * * *